(12) United States Patent
Clampitt

(10) Patent No.: US 6,566,206 B2
(45) Date of Patent: May 20, 2003

(54) SEMICONDUCTOR STRUCTURE HAVING MORE USABLE SUBSTRATE AREA AND METHOD FOR FORMING SAME

(75) Inventor: Darwin A. Clampitt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 09/948,496

(22) Filed: Sep. 6, 2001

(65) Prior Publication Data
US 2002/0055231 A1 May 9, 2002

Related U.S. Application Data

(62) Division of application No. 09/613,003, filed on Jul. 10, 2000, now Pat. No. 6,403,430, which is a division of application No. 09/291,415, filed on Apr. 13, 1999, now Pat. No. 6,198,158, which is a division of application No. 09/075,391, filed on May 8, 1998, now Pat. No. 6,034,417.

(51) Int. Cl.⁷ ................ H01L 21/336; H01L 21/3205
(52) U.S. Cl. ................ 438/296; 438/197; 438/589
(58) Field of Search ............... 438/589, 703, 438/713, 978, FOR 458, 197, 296, 701

(56) References Cited

U.S. PATENT DOCUMENTS

| | | | |
|---|---|---|---|
| 4,171,234 A | 10/1979 | Nagata et al. | 148/175 |
| 4,501,016 A | 2/1985 | Persoon et al. | 382/22 |
| 5,338,942 A | 8/1994 | Nishida et al. | 257/17 |
| 5,656,842 A | 8/1997 | Iwamatsu et al. | 257/329 |
| 5,763,925 A | 6/1998 | Hsu | 257/390 |
| 5,896,347 A | 4/1999 | Tomita et al. | 365/233 |
| 6,034,417 A | 3/2000 | Clampitt | 257/623 |
| 6,069,390 A | 5/2000 | Hsu et al. | 257/371 |

FOREIGN PATENT DOCUMENTS

| | | |
|---|---|---|
| EP | 0 121 068 A | 3/1983 |
| JP | 1 276 669 A | 11/1989 |
| JP | 4 01 293 648 A | 11/1989 |
| JP | 5 343 681 A | 12/1993 |

*Primary Examiner*—Olik Chaudhuri
*Assistant Examiner*—Thanh V Pham
(74) *Attorney, Agent, or Firm*—Dorsey & Whitney LLP

(57) ABSTRACT

A semiconductor structure includes a first substrate portion having a surface and a first active region disposed in the first substrate portion. An insulator region is disposed on the first substrate portion outside of the first active region and extends out from the surface. A second substrate portion is disposed on the insulator region, and a second active region is disposed in the second substrate portion. Thus, by disposing a portion of the substrate on the isolation region, the usable substrate area is dramatically increased.

12 Claims, 5 Drawing Sheets

SEMICONDUCTOR STRUCTURE HAVING MORE USABLE SUBSTRATE AREA AND METHOD FOR FORMING SAME

CROSS-REFERENCE TO RELATED APPLICATION

This application is a divisional of U.S. patent application Ser. No. 09/613,003, filed Jul. 10, 2000 now U.S. Pat. No. 6,403,430 which is a divisional of U.S. patent application Ser. No. 09/291,415, filed Apr. 13, 1999 and issued as U.S. Pat. No. 6,198,158 B1 which is a divisional of U.S. patent application Ser. No. 09/075,391, filed May 8, 1998 and issued as U.S. Pat. No. 6,034,417.

TECHNICAL FIELD

The invention relates generally to integrated circuits, and more specifically to a semiconductor structure having an increased ratio of usable to unusable substrate surface area. The usable substrate area is where transistors and other active devices are disposed.

BACKGROUND OF THE INVENTION

As customers continue to push for smaller, higher-performance integrated circuits (ICs), IC manufacturers continue their efforts to squeeze more transistors and other components onto smaller dies. For example, the present trend is toward memory circuits that have greater storage capacities but that are no larger than their predecessors.

One technique for increasing an IC's component density is to reduce the minimum feature size of a process—the minimum allowable width of, e.g., a transistor gate or an interconnection line—and thus reduce the sizes of the components themselves. Although manufacturers have made great strides in this area over the last few years, there are problems, such as degradation of transistor performance at smaller sizes, that they must overcome before the minimum feature size can be further reduced.

Another density-increasing technique is to use silicon-trench isolation (STI) instead of local oxidation of a semi-conductor (LOCOS). But although STI significantly increases the ratio of usable to unusable substrate area as compared to LOCOS, the widths of the STI regions can be no narrower than the minimum feature size, and thus cannot be reduced until the minimum feature size is reduced.

SUMMARY OF THE INVENTION

In one aspect of the invention, a semiconductor structure includes a first substrate portion having a surface, and a first active region disposed in the first substrate portion. An isolation region is disposed on the first substrate portion outside of the first active region and extends out from the surface. A second substrate portion is disposed on the isolation region, and a second active region is disposed in the second substrate portion.

Thus, by disposing portions of the substrate on the isolation regions, a manufacturer can dramatically increase the usable area of the substrate.

DETAILED DESCRIPTION OF THE INVENTION

Figure 1:
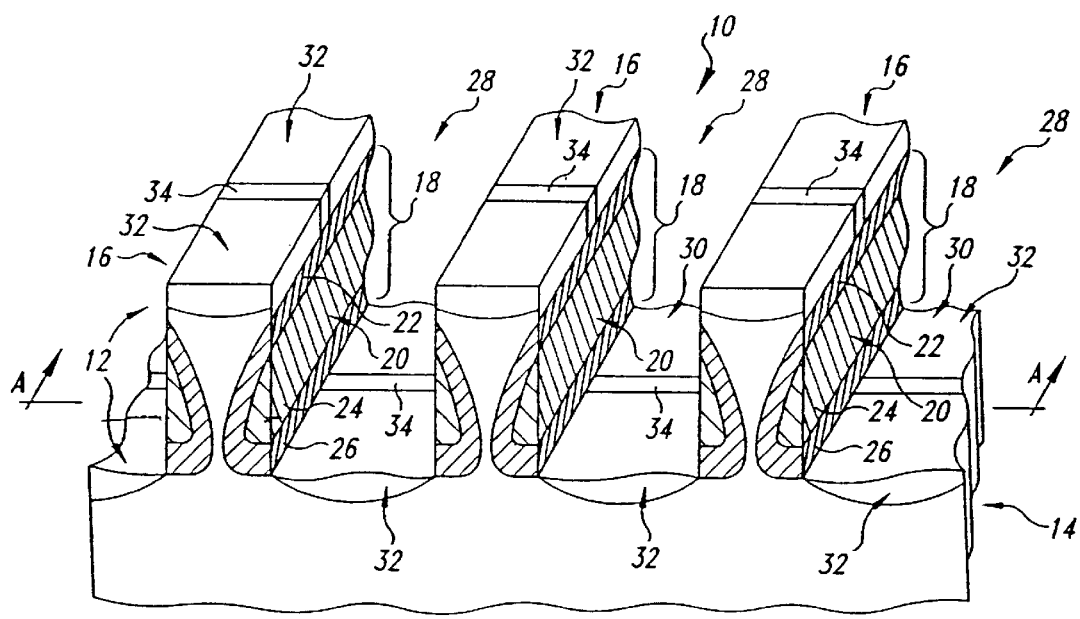
FIG. 1 is an isometric view with portions broken away of a semiconductor structure according to an embodiment of the invention.

FIG. 1 is an isometric view with portions broken away of a semiconductor structure 10 according to an embodiment of the invention. As discussed below, the structure 10 has a significantly higher ratio of usable to unusable substrate area than semiconductor structures that use conventional isolation techniques such as STI or LOCOS.

The structure 10 includes a substrate 12, which is formed from a semiconductor material such as silicon or gallium arsenide (Ga—As), and which has a first portion 14 and one or more second portions 16. The second substrate portions 16 are disposed at the top of isolation runners 18, which electrically isolate the first substrate portion 14 from the respective second substrate portions 16. Although three second substrate portions 16 and three runners 18 are shown, there can be more or fewer portions 16 and runners 18. The runners 18 include side walls 20, which are formed from a conventional dielectric material such as silicon dioxide. In one embodiment, the runners 18 are substantially parallel to and evenly spaced from one another. In another embodiment, the runners 18 include multiple layers 22, 24, and 26, which may be formed from any conventional materials so long as these layers electrically isolate the first substrate portion 14 from the second substrate portions 16. The runners 18 define trenches 28 having bottoms 30, which are respective surface regions of the first substrate portion 14. Conventional active regions 32—in which, for example, the source/drain regions of transistors are located—are disposed in the trench bottoms 30 (recessed active regions 32) and in the surface regions of the second substrate portions 16 (elevated active regions 32). Thus, by placing the second substrate portions 16 at the top of the respective runners 18, one uses vertical isolation instead of horizontal isolation so that compared to conventional semiconductor structures, the structure 10 has a much greater portion of the substrate 12 surface area in which to form transistors and other components.

In another embodiment of the structure 10, conventional isolation regions 34, such as STI regions, are disposed in the trench bottoms 30 and in the second substrate portions 16 to isolate adjacent active areas 32 from one another. Although these regions 34 reduce the usable portion of the substrate 12 surface area, the structure 10 still has approximately 50% more usable substrate surface area than a conventional semiconductor structure.

In yet another embodiment, the cross-sections of the runners 18 and trenches 28 may have shapes other than rectangular.

FIGS. 3–7 are cross-sections taken along lines A—A of FIG. 1 at points of a process for forming the structure 10 according to an embodiment of the invention.

Figure 2:
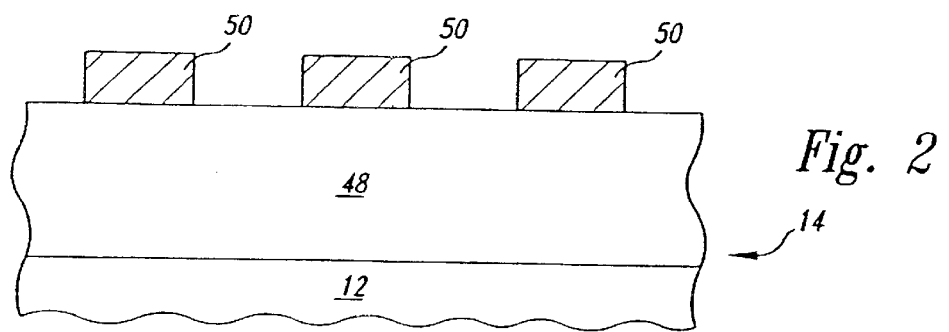
FIG. 2 is a cross-sectional view of a semiconductor structure at one point in a process for forming the structure of FIG. 1 according to an embodiment of the invention.

Referring to FIG. 2, well regions 48 are formed by conventionally doping the substrate 12. For clarity, only one well region 48 is shown. Next, a layer of photoresist 50 is conventionally formed on the substrate 12 and then conventionally patterned.

Figure 3:
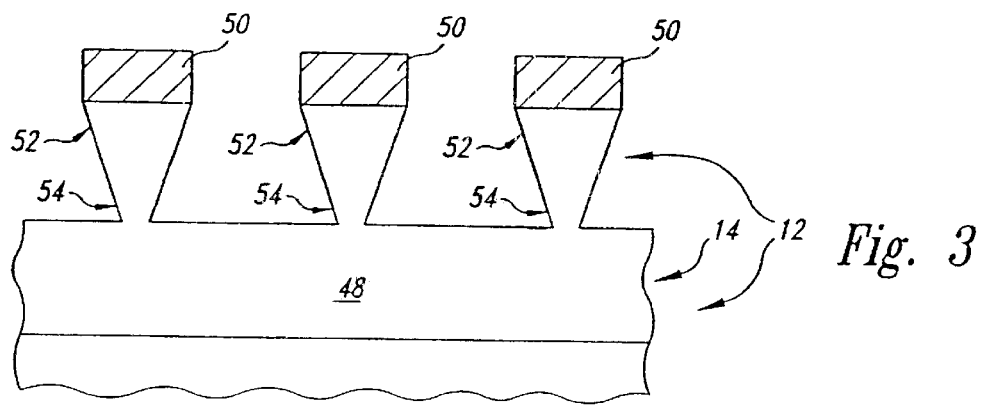
FIG. 3 is a cross-sectional view of the structure of FIG. 2 at a subsequent point in the process.

Next, referring to FIG. 3, a retrograde profile is conventionally etched into the substrate 12 to form semiconductor towers 52, which have side walls that taper toward the first substrate portion 14 and end in necks 54.

Figure 4:
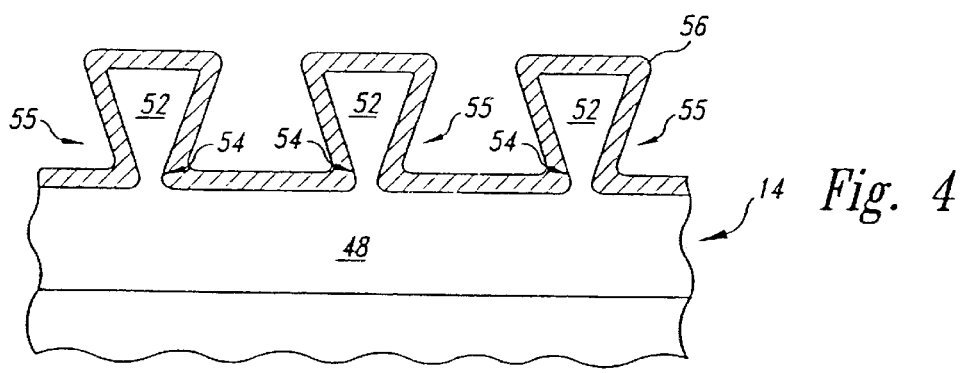
FIG. 4 is a cross-sectional view of the structure of FIG. 3 at a subsequent point in the process.

Referring to FIG. 4, the photoresist 50 is removed. Then, a layer 56 of thermal oxide is conventionally grown on the towers 52 and the substrate portion 14 to reduce the thicknesses of the necks 54 while forming combined necks 55, which are thicker than the necks 54 were before oxidation. This increases both the electrical isolation and the strength of the attachment between the towers 52 and the substrate portion 14. Alternatively, in embodiments where the necks 54 provide adequate isolation and support before thermal oxidation, then the thermal oxidation step can be omitted.

Figure 5:
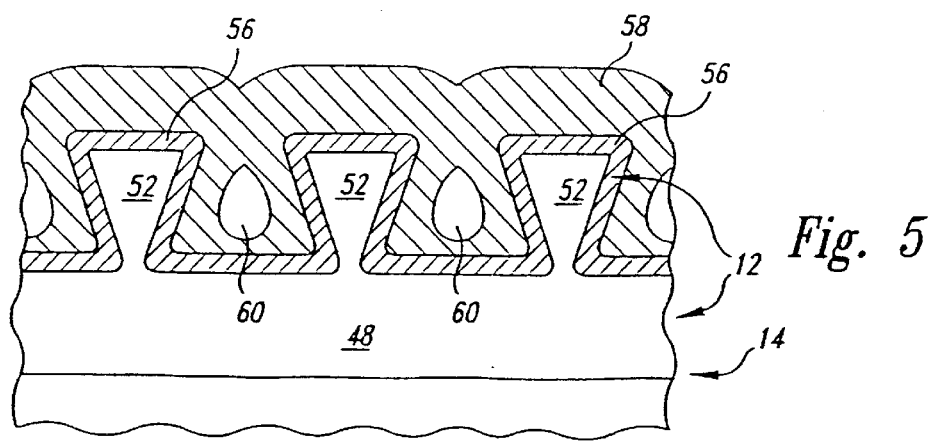
FIG. 5 is a cross-sectional view of the structure of FIG. 4 at a subsequent point in the process.

Referring to FIG. 5, a layer 58 of a conventional dielectric is formed on the towers 52 and the substrate portion 14. For example, the layer 56 is preferably formed from tetraethylorthosilicate (TEOS), or any other dielectric that can withstand the process heating cycles, has a low enough dielectric constant, and does not contaminate or stress the substrate 12.

Still referring to FIG. 5, in some embodiments the layer 58 "bread loaves" and forms voids 60 between the towers 52. But as long as portions of the layer 58 are formed on the tower 52 side walls, the voids 60 typically cause no problems.

Figure 6:
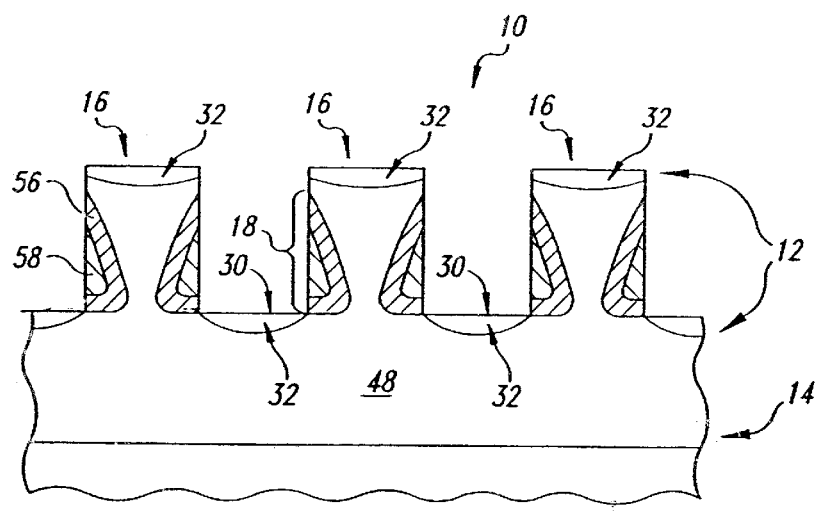
FIG. 6 is a cross-sectional view of the structure of FIG. 5 at a subsequent point in the process.

Referring to FIG. 6, the layers 56 and 58 are anisotropically etched in a conventional manner. This etching forms the isolation runners 18 from the remaining portions of the layers 56 and 58 and exposes the trench bottoms 30 and the second substrate portions 16. In one embodiment, the etchant used is highly selective to the insulator layer 58 to reduce or eliminate pitting of the substrate portions 16. Next, the active areas 32 are conventionally formed.

Still referring to FIG. 6, in one embodiment, the isolation regions 34 are then formed to give the structure 10 of FIG. 1.

Figure 7:
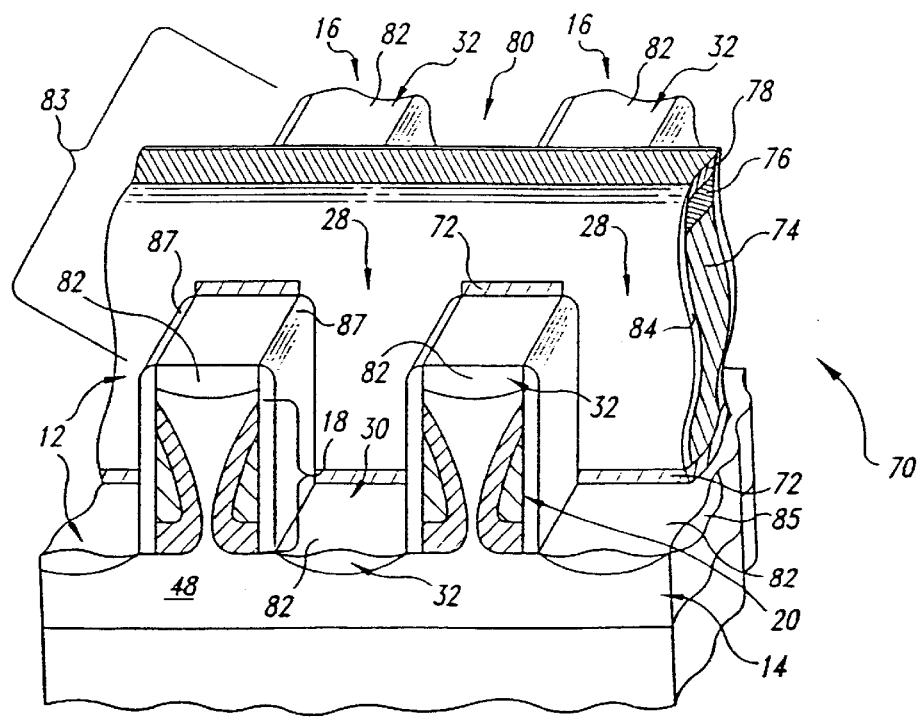
FIG. 7 is an isometric and cross-sectional view of a portion of a memory array according to an embodiment of the invention.

FIG. 7 is an isometric and cross-sectional view of a portion of a memory array 70 according to an embodiment of the invention. The memory array 70 is formed from the structure 10 of FIG. 1 without the isolation regions 34. In one embodiment, the array 70 is a dynamic-random-access-memory (DRAM) array.

To form the array 70, a gate dielectric 72 is conventionally formed on the active regions 32 of FIG. 6. Next, a conductive layer 74 is conventionally formed on the gate dielectric 72 and planarized. Another conductive layer 76 is then conventionally formed on the layer 74, and a capping layer 78 is conventionally formed on the layer 76. In one embodiment, the layer 74 is polysilicon, the layer 76 is tungsten silicide, and the layer 78 is silicon nitride.

Next, the layers 76 and 78 are conventionally patterned and etched, and the layer 74 is anisotropically etched in a conventional manner to form word lines 80, and, in some embodiments, isolation lines (not shown in FIG. 7) as discussed below in conjunction with FIG. 8. Where the layer 74 is polysilicon, an etchant that is highly selective to polysilicon is used to thoroughly remove the exposed portions of the layer 74 from the trenches 28 without etching through the gate dielectric 72 and pitting the substrate portions 16. In one embodiment, this highly selective etch is followed by a short, isotropic etch to remove any polysilicon stringers from the sidewalls 20 of the trenches 28. Alternatively, the array 70 can be run through a furnace to oxidize any such polysilicon stringers.

Next, transistor source/drain regions 82 are formed in the active regions 32. The regions 82 and the word lines 80, which act as transistor gates, form memory-cell access transistors 83 in the both the substrate portions 16 and trench bottoms 30. Each transistor 83 includes a pair of adjacent source/drain regions 82 that are on opposite sides of the same word line 80. Depending on the doping process used, the exposed portions of the gate dielectric 72 are conventionally removed either before or after the regions 82 are formed.

To form the source/drain regions 82, for example, source/drain regions 82 of P-channel transistors that are formed in an N well 48, the active regions 32 are first conventionally implanted with a relatively light concentration of dopant to form lightly doped drain (LDD) regions 85. Next, spacers 84 are conventionally formed along the side walls of the word lines 80. In some embodiments, this process also forms spacers 87 along the side walls 20 of the isolation runners 18 and along the sides of the substrate portions 16. Although the spacers 87 are not required to form the LDD regions 85, in some embodiments they are useful in a later process step to align source and drain contacts with the trench bottoms 30. Then, the exposed portions of the active regions 32 are conventionally implanted with a relatively heavy dose of dopant to form the remaining portions of the source/drain regions 82.

Next, the remaining parts of the memory array 70, such as the capacitors, digit lines, and interconnections (none shown in FIG. 7), are formed in a conventional manner.

Figure 8:
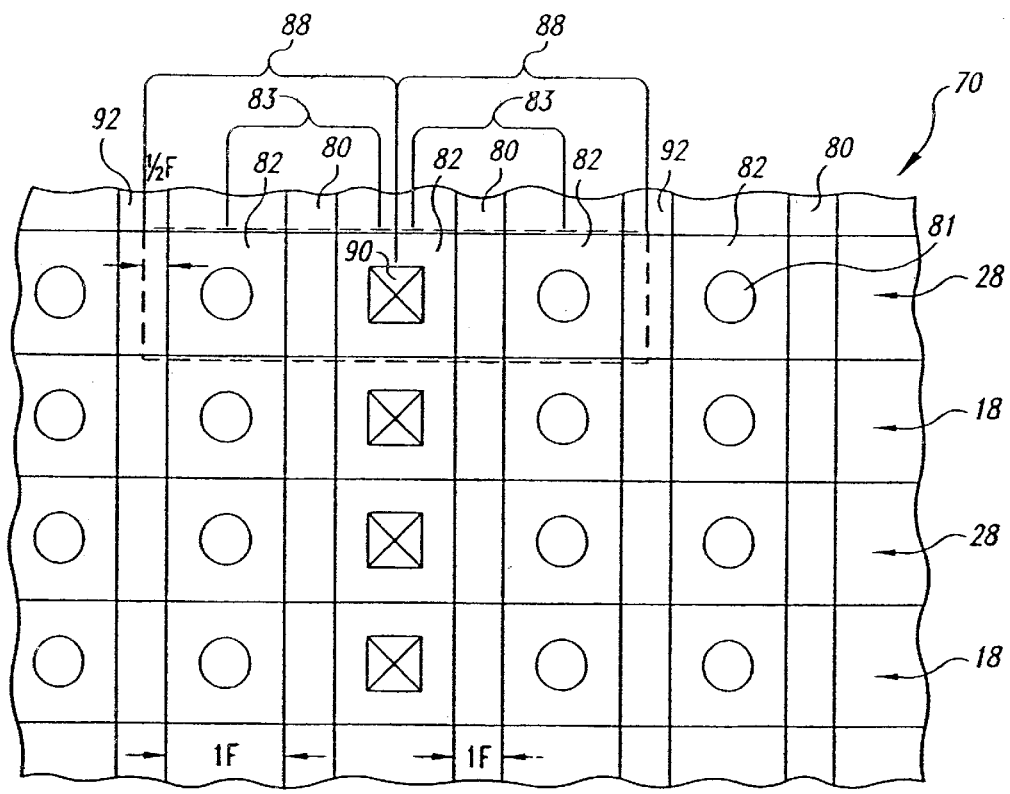
FIG. 8 is a top plan view of the memory array of FIG. 7 after further processing.

FIG. 8 is a top plan view of the memory array 70 of FIG. 7 after digit lines (not shown in FIG. 8) and cell capacitors 81 have been formed over respective source/drain regions 82. In one embodiment, pairs of adjacent word lines 80 intersect pairs of adjacent memory cells 88 that share a common digit-line contact 90. Each word line 80 thus defines a row of memory cells 88, which each include a respective transistor 83 and capacitor 81. Isolation lines 92, which have the same structure as the word lines 80, are disposed between these word-line pairs and between adjacent memory cells 88 that do not share a common digit-line contact. Thus, the isolation lines 92 act as pseudo-gates between adjacent source/drain regions 82 of such uncommon cells 88. The isolation lines 92 are voltage biased to isolate these adjacent source/drain regions 82 by preventing a channel region from forming therebetween. For example, for N-channel transistors 83 (FIG. 7), the isolation lines 92 are biased at a low voltage such as ground.

The memory array 70 has a much greater memory-cell density than conventional memory arrays. For example, in one embodiment, the widths of the isolation runners 18, trenches 28, word lines 80 and isolation lines 92, and source/drain regions 82 are one minimum feature size. Therefore, as shown by the dashed line, a pair of cells 88 that share a common digit-line contact 90 have a combined area of six square feature sizes. It follows that one of the memory cells 88 occupies half that area, that is, three square feature sizes. In comparison, a memory cell of a conventional folded-digit-line DRAM occupies eight square feature sizes, and a memory cell of a conventional open-digit-line DRAM occupies six square feature sizes. Thus, memory cell 88 occupies only about half of the area occupied by a conventional memory cell.

Figure 9:
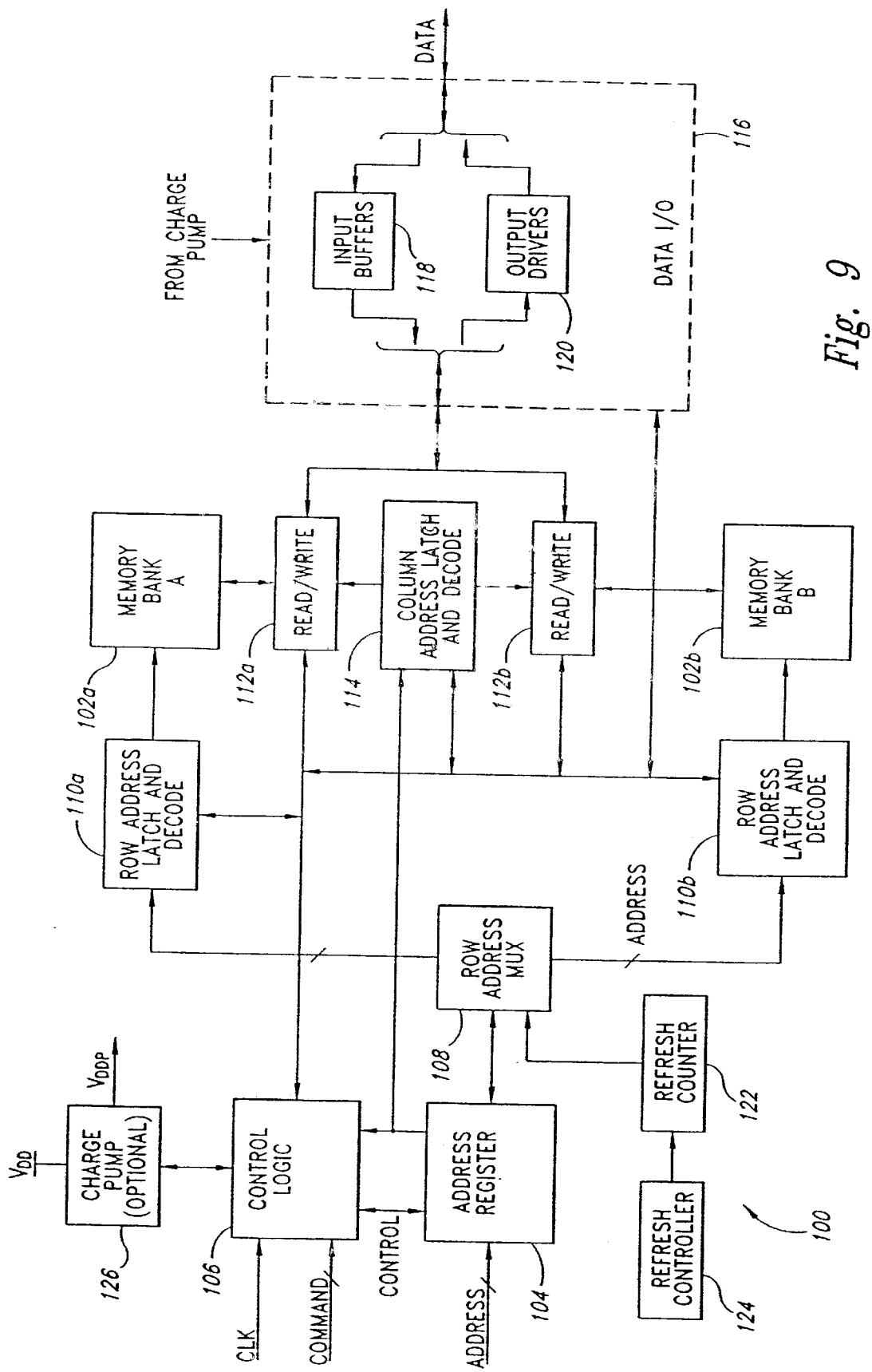
FIG. 9 is a block diagram of one embodiment of a memory circuit that incorporates the memory array of FIGS. 7 and 8.

FIG. 9 is a block diagram of a memory circuit 100, which may include the memory array 70 of FIGS. 7 and 8. Specifically, memory banks 102a and 102b of the memory circuit 100 may each include respective memory array 70 of FIGS. 7 and 8. In one embodiment, the memory circuit 100 is a DRAM.

The memory circuit 100 includes an address register 104, which receives an address from an ADDRESS bus, a control logic circuit 106 receives a clock (CLK) signal, and receives, e.g., clock enable (CKE), chip select ($\overline{CS}$), row address strobe ($\overline{RAS}$), column address strobe ($\overline{CAS}$), and write enable ($\overline{WE}$) signals from a COMMAND bus, and communicates with the other circuits of the memory circuit 100. A row address multiplexer 108 receives the address signal from the address register 104 and provides the row address to the row-address latch-and-decode circuits 110a and 110b for the memory banks 102a or 102b, respectively. During read and write cycles, the row-address latch-and-decode circuits 110a and 110b activate the word lines of the addressed rows of memory cells in the memory banks 102a and 102b, respectively. Read/write circuits 112a and 112b read data from the addressed memory cells in the memory banks 102a and 102b, respectively, during a read cycle, and write data to the addressed memory cells during a write cycle. A column-address latch-and-decode circuit 114 receives the address from the address register 104 and provides the column address of the selected memory cells to the read/write circuits 112a and 112b. For clarity, the address register 104, the row-address multiplexer 108, the row-address latch-and-decode circuits 110a and 110b, and the column-address latch-and-decode circuit 114 can be collectively referred to as an address decoder.

A data input/output (I/O) circuit 116 includes a plurality of input buffers 118. During a write cycle, the buffers 118 receive and store data from the DATA bus, and the read/write circuits 112a and 112b provide the stored data to the memory banks 102a and 102b, respectively. The data I/O circuit 116 also includes a plurality of output drivers 120. During a read cycle, the read/write circuits 112a and 112b provide data from the memory banks 102a and 102b, respectively, to the drivers 120, which in turn provide this data to the DATA bus.

A refresh counter 122 stores the address of the row of memory cells to be refreshed either during a conventional auto-refresh mode or self-refresh mode. After the row is refreshed, a refresh controller 124 updates the address in the refresh counter 122, typically by either incrementing or decrementing the contents of the refresh counter 122 by one. Although shown separately, the refresh controller 124 may be part of the control logic 106 in other embodiments of the memory circuit 100.

The memory circuit 100 may also include an optional charge pump 126, which steps up the power-supply voltage $V_{DD}$ to a voltage $V_{DDP}$. In one embodiment, the pump 126 generates $V_{DDP}$ approximately 1–1.5 V higher than $V_{DD}$. The memory circuit 100 may also use $V_{DDP}$ to conventionally overdrive selected internal transistors.

Figure 10:
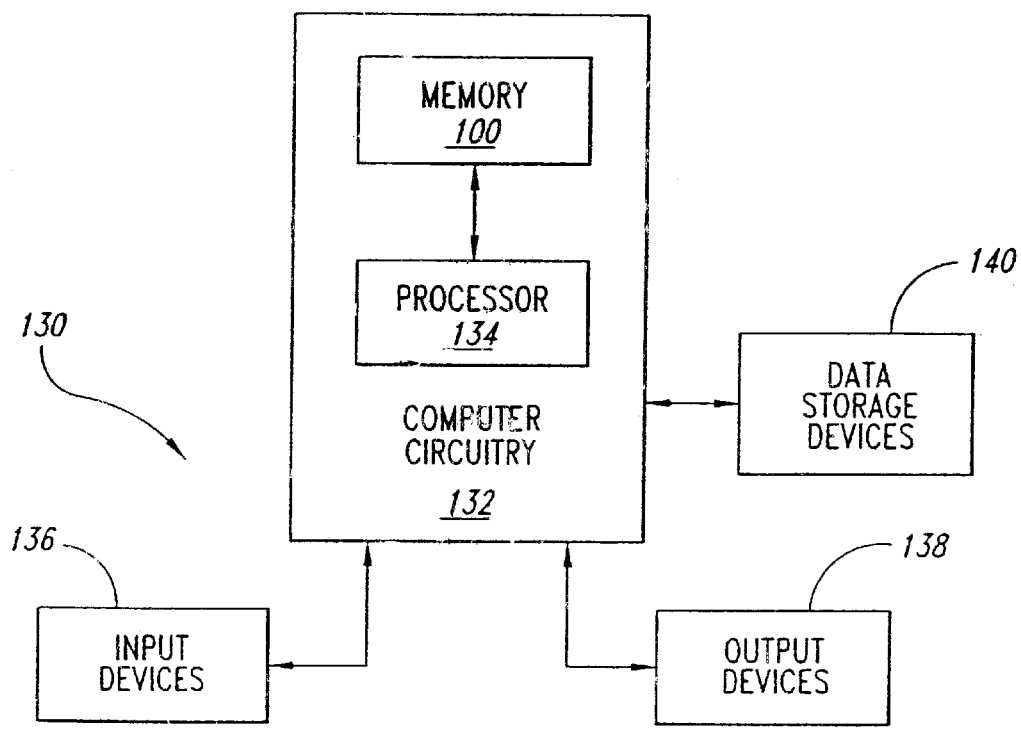
FIG. 10 is a block diagram of one embodiment of an electronic system that incorporates the memory circuit of FIG. 9.

FIG. 10 is a block diagram of an electronic system 140, such as a computer system, that incorporates the memory circuit 100 of FIG. 9. The system 130 includes computer circuitry 132 for performing computer functions, such as executing software to perform desired calculations and tasks. The circuitry 132 typically includes a processor 134 and the memory circuit 100, which is coupled to the processor 134. One or more input devices 136, such as a keyboard or a mouse, are coupled to the computer circuitry 132 and allow an operator (not shown) to manually input data thereto. One or more output devices 138 are coupled to the computer circuitry 132 to provide to the operator data generated by the computer circuitry 132. Examples of such output devices 138 include a printer and a video display unit. One or more data-storage devices 140 are coupled to the computer circuitry 132 to store data on or retrieve data from external storage media (not shown). Examples of the storage devices 140 and the corresponding storage media include drives that accept hard and floppy disks, tape cassettes, and compact disc read-only memories (CD-ROMs). Typically, the computer circuitry 132 includes address data and command buses and a clock line that are respectively coupled to the ADDRESS, DATA, and COMMAND buses, and the CLK line of the memory device 100.

From the foregoing it will be appreciated that, although specific embodiments of the invention have been described herein for purposes of illustration, various modifications may be made without deviating from the spirit and scope of the invention.

What is claimed is:

1. A method for forming a semiconductor structure, comprising:

forming alternating and substantially parallel runners and trenches in a semiconductor substrate, the runners having side walls that taper toward the substrate, the runners having tops cross-sectional area larger than necks cross sectional area; and the trenches having bottoms that face away from the substrate;

forming a dielectric layer on the runners and in the trenches;

removing the dielectric layer from the tops of the runners and the bottoms of the trenches and leaving the dielectric layer on the side walls; and forming active regions in the tops of the runners and bottoms of the trenches.

2. The method of claim 1, further comprising:

growing a thermal oxide on the runners before forming the dielectric layer to strengthen respective connection regions between the runners and a remaining portion of the substrate; and wherein the removing includes removing the thermal oxide from the tops of the runners and the bottoms of the trenches.

3. The method of claim 1, further comprising:

forming isolation regions in the tops of the runners between adjacent active regions; and forming isolation regions in the bottoms of the trenches between adjacent active regions.

4. The method of claim 1 wherein the forming active regions comprises forming well regions in the semiconductor substrate before forming the runners and trenches.

5. A method for forming a memory array, comprising:

forming alternating and substantially parallel runners and trenches in a semiconductor substrate, the runners having side walls that taper toward the substrate, the runners having tops cross-sectional area larger than necks cross sectional area and the trenches having bottoms that face away from the substrate;

forming a dielectric layer on the runners and in the trenches;

removing the dielectric layer from the tops of the runners and the bottoms of the trenches and leaving the dielectric layer on the side walls;

forming a gate dielectric on the tops of the runners and on the bottoms of the trenches;

forming on the gate dielectric word lines that are substantially perpendicular to the runners and trenches; and forming memory-cell-transistor source/drain regions adjacent to the word lines in the tops of the runners and in the bottoms of the trenches.

6. The method of claim 5, further comprising:

growing a thermal oxide on the runners before forming the dielectric layer to strengthen respective attachment regions between the runners and a remaining portion of the substrate; and wherein the removing includes removing the thermal oxide from the tops of the runners and the bottoms of the trenches.

7. The method of claim 5, further comprising forming isolation lines on the gate dielectric, the isolation lines being substantially perpendicular to the runners and trenches.

8. The method of claim 5, further comprising forming isolation lines on the gate dielectric between pairs of adjacent word lines.

9. The method of claim 5, further comprising forming isolation lines on the gate dielectric between pairs of adjacent word lines before forming the source/drain regions.

10. The method of claim 5 wherein forming the source/drain regions comprises:

doping exposed portions of the tops of the runners and bottoms of the trenches with a first concentration of a first dopant;

forming spacers side walls of the word lines; and doping the exposed portions of the tops of the runners and bottoms of the trenches with a second concentration of a second dopant, the second concentration being significantly greater than the first concentration.

11. The method of claim 10 wherein the first and second dopants are the same dopant.

12. The method of claim 10 wherein the first and second dopants have the same conductivity.

* * * * *

UNITED STATES PATENT AND TRADEMARK OFFICE
CERTIFICATE OF CORRECTION

PATENT NO. : 6,566,206 B2
DATED : May 20, 2004
INVENTOR(S) : Darwin A. Clampitt

It is certified that error appears in the above-identified patent and that said Letters Patent is hereby corrected as shown below:

Column 4,
Line 14 reads "in the both the substrate" should read -- in both the substrate --

Column 6,
Lines 32-33, reads "having tops cross-sectional area larger than necks cross sectional area; and the trenches" should read -- having tops with a cross-sectional area larger than the neck's cross-sectional area, and the trenches --
Lines 63-64, "having tops cross-sectional area larger than necks cross sectional area and the trenches" should read -- having tops with a cross-sectional area larger than the neck's cross-sectional area, and the trenches --

Column 8,
Line 13, reads "forming spacers side walls" should read -- forming spacers along the side walls --

Signed and Sealed this

Twenty-second Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,566,206 B2 Page 1 of 1
APPLICATION NO. : 09/948496
DATED : May 20, 2003
INVENTOR(S) : Darwin A. Clampitt It is certified that error appears in the above-identified patent and that said Letters Patent is hereby corrected as shown below:

Column 4,
Line 14 reads "in the both the substrate" should read -- in both the substrate --

Column 6,
Lines 32-33, reads "having tops cross-sectional area larger than necks cross sectional area; and the trenches" should read -- having tops with a cross-sectional area larger than the neck's cross-sectional area, and the trenches --
Lines 63-64, "having tops cross-sectional area larger than necks cross sectional area and the trenches" should read -- having tops with a cross-sectional area larger than the neck's cross-sectional area, and the trenches --

Column 8,
Line 13, reads "forming spacers side walls" should read -- forming spacers along the side walls --

This certificate supersedes Certificate of Correction issued June 22, 2004.

Signed and Sealed this

First Day of May, 2007

JON W. DUDAS
*Director of the United States Patent and Trademark Office*